(12) United States Patent
Jin

(10) Patent No.: US 10,090,156 B2
(45) Date of Patent: Oct. 2, 2018

(54) METHOD FOR FORMING SEMICONDUCTOR STRUCTURE HAVING STRESS LAYERS

(71) Applicants: Semiconductor Manufacturing International (Shanghai) Corporation, Shanghai (CN); Semiconductor Manufacturing International (Beijing) Corporation, Beijing (CN)

(72) Inventor: Lan Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/477,250

(22) Filed: Apr. 3, 2017

(65) Prior Publication Data
US 2017/0330758 A1    Nov. 16, 2017

(30) Foreign Application Priority Data
May 12, 2016 (CN) .......................... 2016 1 0315837

(51) Int. Cl.
*H01L 21/336* (2006.01)
*H01L 21/285* (2006.01)
(Continued)

(52) U.S. Cl.
CPC .... *H01L 21/28518* (2013.01); *H01L 21/0262* (2013.01); *H01L 21/02123* (2013.01);
(Continued)

(58) Field of Classification Search
CPC ......... H01L 21/28518; H01L 29/66636; H01L 21/02532; H01L 21/02123; H01L 21/3065;
(Continued)

(56) References Cited

U.S. PATENT DOCUMENTS

| 7,939,891 B2* | 5/2011 | Matsuo | H01L 29/0847 257/351 |
| 2007/0020864 A1* | 1/2007 | Chong | H01L 29/165 438/300 |

(Continued)

OTHER PUBLICATIONS

The European Patent Office (EPO) The Extended European Search Report for 17169812.9 dated Sep. 12, 2017 7 Pages.

*Primary Examiner* — Shouxiang Hu
(74) *Attorney, Agent, or Firm* — Anova Law Group, PLLC

(57) ABSTRACT

A method is provided for fabricating a semiconductor structure. The method includes providing a substrate including a first region for forming a first transistor and a second region for forming a second transistor. The method also includes forming a first stress layer in the substrate in the first region and a second stress layer in the substrate in the second region, wherein top surfaces of the first stress layer and the second stress layer are above a surface of the substrate. Further, the method includes forming a cover layer on each of the first stress layer and the second stress layer, and removing portions of the cover layer formed on adjacent side surfaces of the first stress layer and the second stress layer.

20 Claims, 4 Drawing Sheets

(51) Int. Cl.
*H01L 21/8238* (2006.01)
*H01L 21/02* (2006.01)
*H01L 21/3065* (2006.01)
*H01L 21/8234* (2006.01)
*H01L 29/66* (2006.01)
*H01L 29/78* (2006.01)
*H01L 29/165* (2006.01)

(52) U.S. Cl.
CPC .. *H01L 21/02211* (2013.01); *H01L 21/02532* (2013.01); *H01L 21/02636* (2013.01); *H01L 21/28556* (2013.01); *H01L 21/3065* (2013.01); *H01L 21/823418* (2013.01); *H01L 21/823814* (2013.01); *H01L 29/665* (2013.01); *H01L 29/66636* (2013.01); *H01L 29/7848* (2013.01); *H01L 29/165* (2013.01)

(58) Field of Classification Search
CPC ........... H01L 29/7848; H01L 21/28556; H01L 29/665; H01L 21/02211; H01L 21/02636; H01L 21/823418; H01L 21/0262; H01L 29/165; H01L 21/823814
USPC .......................................................... 438/300
See application file for complete search history.

(56) References Cited

U.S. PATENT DOCUMENTS

| | | |
|---|---|---|
| 2012/0056245 A1 | 3/2012 | Kang et al. |
| 2013/0149830 A1 | 6/2013 | Rhee et al. |
| 2015/0206974 A1* | 7/2015 | Lim .................... H01L 29/7851 257/288 |
| 2016/0020301 A1 | 1/2016 | Park et al. |
| 2016/0027918 A1* | 1/2016 | Kim .................... H01L 29/7848 257/401 |

* cited by examiner

METHOD FOR FORMING SEMICONDUCTOR STRUCTURE HAVING STRESS LAYERS

CROSS-REFERENCES TO RELATED APPLICATIONS

This application claims the priority of Chinese patent application No. 201610315837.4, filed on May 12, 2016, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

With the continuous development of semiconductor technology, dimensions of semiconductor devices continue to decrease. With the reduction of the dimensions of the semiconductor devices, the, impact of contact resistance of Metal-Oxide-Semiconductor (MOS) transistors on the performance of the MOS transistors and the performance of the entire semiconductor chip is gradually increased. To improve the performance of the semiconductor chip, the contact resistance of the MOS transistors needs to be reduced. With the reduction of the dimensions of the semiconductor devices, the areas of the source region and the drain region become smaller and smaller. Therefore, the contact resistance between the source region, the drain region and the metal plug increases as the dimension of the semiconductor device decreases. The large contact resistance between the source region/drain region and the metal plug affects the performance of the MOS transistor and limits the operation speed of the semiconductor device.

Self-aligned silicide (Salicide) formed on the source region/drain region can effectively reduce the contact resistance between the source region/drain region and the metal plug. Currently, the process for forming the self-aligned silicide often includes: forming a metal layer on the silicon layer by an evaporation process, or a sputtering process; performing an annealing process, thus the metal and silicon can react with each other to form metal silicide; and removing the unreacted metal layer.

In addition, to improve the operating speed of the chip and to improve the performance of the MOS transistor, the mobility of carriers in the channel is improved by introducing a stress layer in the source region and the drain region of the MOS transistor. The source region and the drain region of the MOS transistor made of germanium silicon material or carbon silicon material can introduce compressive stress or tensile stress in the channel region of the MOS transistor, thus improving the performance of the MOS transistor.

However, with the reduction of the dimensions of the semiconductor devices, the dimensions of the MOS transistors also decrease accordingly, the self-aligned silicide may be more difficult to form, resulting in the decreasing of the performance of the MOS transistors. The disclosed device structures and methods are directed to solve one or more problems set forth above and other problems.

BRIEF SUMMARY OF THE DISCLOSURE

One aspect of the present disclosure includes a method for fabricating a semiconductor structure, The method includes providing a substrate including, a first region for forming a first transistor and a second region for forming a second transistor. The method also includes forming a first stress layer in the substrate in the first region and a second stress layer in the substrate in the second region, wherein top surfaces of the first stress layer and the second stress layer are above a surface of the substrate. Further, the method includes forming a cover layer on each of the first stress layer and the second stress layer, and removing portions of the cover layer formed on adjacent side surfaces of the first stress layer and the second stress layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
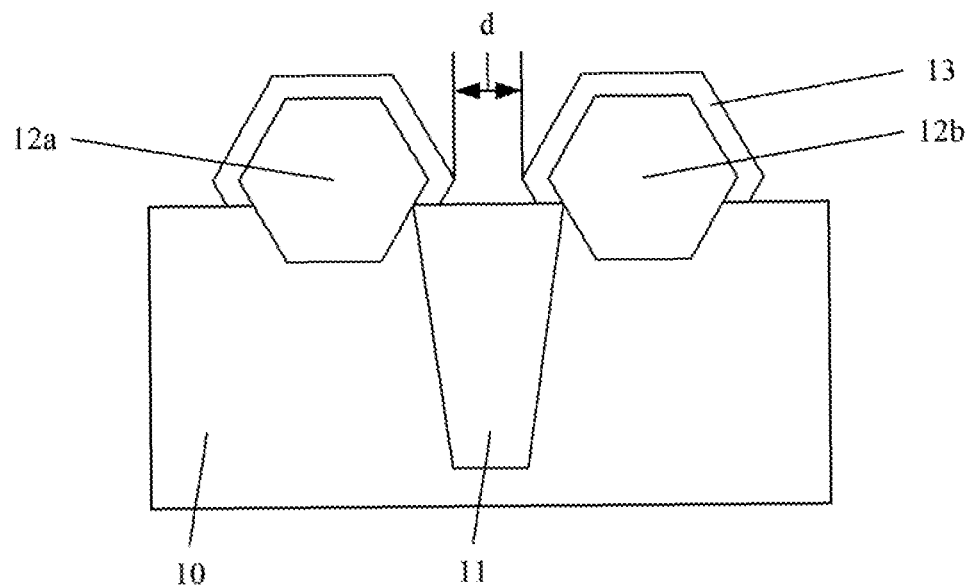
FIG. 1 illustrates an existing semiconductor structure.

FIG. 1 illustrates an existing semiconductor structure. Referring to FIG. 1, the semiconductor structure includes a substrate 10 and an isolation structure 11 formed in the substrate 10. The semiconductor structure also includes a first stress layer 12a and a second stress layer 12b formed in the substrate 10 on both sides of the isolation structure 11. Both the top surfaces of the first stress layer 12a and the second stress layer 12h are above the top surface of isolation substrate 11.

To reduce the contact resistance between a source region and/or a drain region of the transistor and the metal plug, self-aligned silicide is formed on the surfaces of the first stress layer 12a and the second stress layer 12b configured as the source region and/or the drain region. For example, forming the self-aligned silicide includes; forming a silicon cover layer 13 on the surfaces of the first stress layer 12a and the second stress layer 12b; forming a metal layer on the silicon cover layer 13; and performing an annealing process, thus the metal and silicon can react with each other to form a silicide layer.

Because the top surfaces of the first stress layer 12a and the second stress layer 12h are above the top surface of isolation substrate 11, the first stress layer 12a and the, second stress layer 12b have adjacent side surfaces facing toward each other above the isolation structure 11. The silicon cover layer 13 formed on the surfaces of the first stress layer 12a and the second stress layer 121 causes a decreased spacing d between the first stress layer 12a and the second stress layer 12b above the isolation structure 11.

With the reduction of the dimension of the semiconductor device, the spacing between the first stress layer 12a and the second stress layer 12b also decreases accordingly. Therefore, after forming the silicon cover layer 13, spacing between the silicon cover layers 13 formed on the adjacent side surfaces of the first stress layer 12a and the second stress layer 12b becomes smaller, thus easily causing the silicon cover layers 13 formed on the adjacent side surfaces of the first stress layer 12a and the second stress layer 12b to be connected. Then, the metal layer is formed on the silicon cover layer 13, thus the metal silicide formed after performing the annealing process cats be easily connected, resulting in a short-circuit issue between different transistors.

Figure 7:
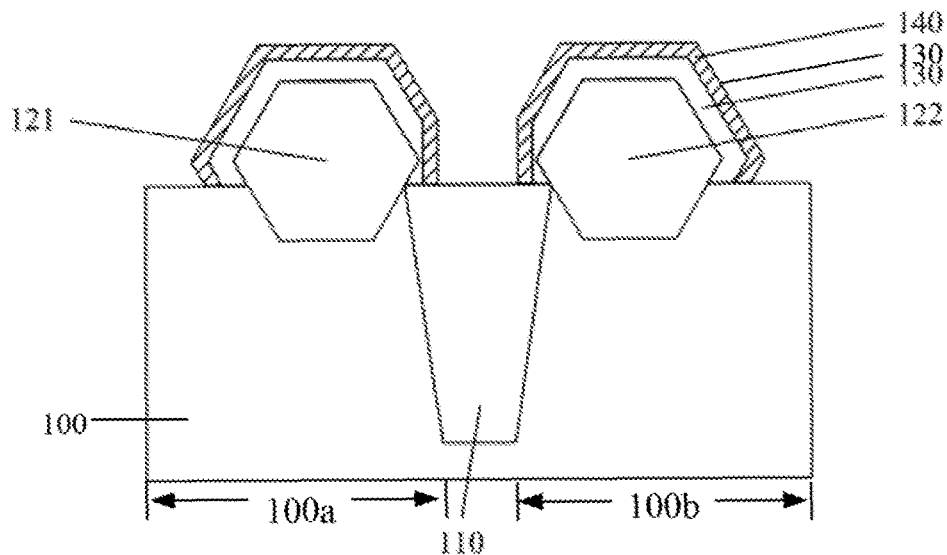
Figure 8:
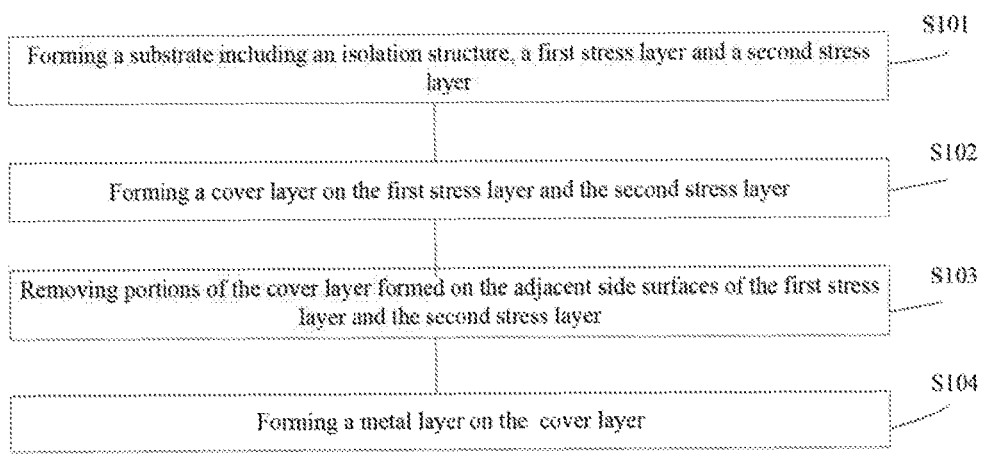
FIG. 8 illustrates an exemplary fabrication process to form a semiconductor structure consistent with various disclosed embodiments of the present disclosure.

The present disclosure provides a semiconductor structure and fabrication method. FIG. 8 illustrates an exemplary fabrication process to form a semiconductor structure consistent with the disclosed embodiments; and FIGS. 2-7 illustrate semiconductor structure corresponding to certain stages of the exemplary fabrication process.

In one embodiment, a semiconductor structure configured to form a PMOS device is described as an example. However, the semiconductor structure consistent with the disclosed embodiments can also be configured to form an NMOS device, a CMOS device, or other types of semiconductor devices.

Figure 2:
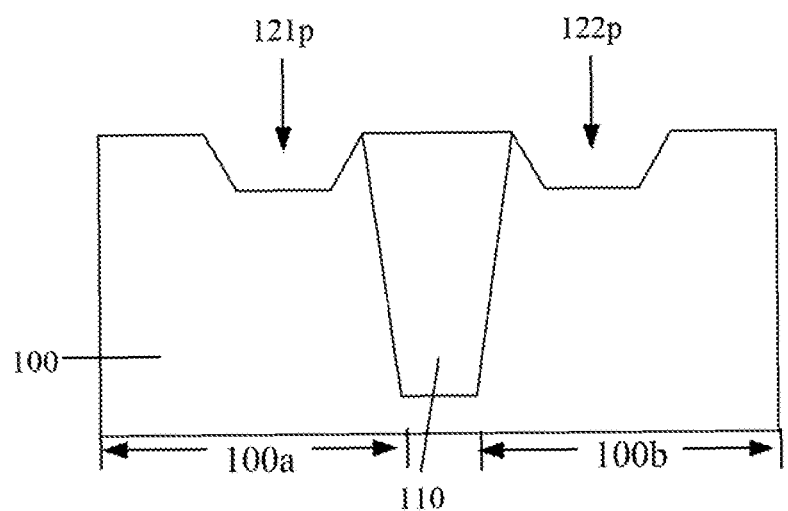
FIGS. 2-7 illustrate semiconductor structures corresponding to certain stages of an exemplary fabrication process to form a semiconductor structure consistent with various disclosed embodiments of the present disclosure.
Figure 3:
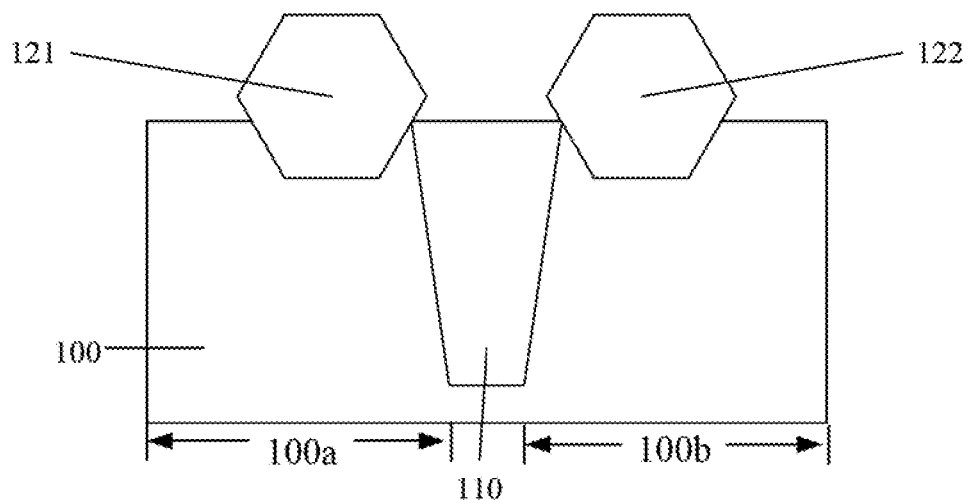

As shown in FIG. 8, at the beginning of the fabrication process, a substrate with certain structures may be formed (S101). FIGS. 2-3 illustrate corresponding semiconductor structures.

Referring to FIG. 2 and FIG. 3, a substrate 100 may be provided. The substrate 100 may include a first region 100a configured to form a first transistor and a second region 100b configured to form a second transistor.

The substrate 100 may provide a platform for subsequent fabrication processes. The substrate 100 may include monocrystalline silicon, polysilicon, or amorphous silicon. The substrate 100 may also include silicon (Si), germanium (Ge), germanium-silicon alloy (GeSi), silicon carbide (SiC), or gallium arsenide (GaAs) and other Group III-V compounds thereof. In addition, the substrate 100 may include any appropriate other semiconductor material(s). Further, the substrate 100 may include a silicon substrate having an epitaxial layer or on an epitaxial layer. In one embodiment, a gate structure to form a planar transistor is included, and the substrate 100 may be a monocrystalline silicon substrate.

In one embodiment, providing the substrate 100 may include forming an isolation structure 110 in the substrate 100. The isolation structure 110 may be configured to divide the substrate 100 into the first region 100a and the second region 100b, in other words, the isolation structure 110 may be formed in the substrate 100 between the first region 100a and the second region 100b. In one embodiment, the isolation structure may be made of an oxide material.

Forming the isolation structure 110 may include: forming a first patterned layer on the substrate 100, where the first patterned layer may be configured to define the size and position of the isolation structure; using the first patterned layer as a mask to etch the substrate 100 to form a trench in the substrate 100; and filling the trench with the insulating material to form the isolation structure 110.

The patterned layer may be a patterned photoresist layer formed by a coating process and a photolithography process. In addition, to reduce dimensions of a subsequently formed metal gate structure and to reduce dimensions of the semiconductor device, the patterned layer may be firmed by a multiple patterned mask process. The multiple patterned mask process may include a self-aligned double patterned process (SaDP), a self-aligned triple patterned process (SaTP), or a self-aligned double double patterned process (SADDP), etc.

Referring to FIG. 2 and FIG. 3, a first stress layer 121 may be formed in the substrate 100 in the first region 100a, and a second stress layer 122 may be formed in the substrate 100 in the second region 100b. Both the top surfaces of the first stress layer 121 and the second stress layer 122 may be above the surface of the substrate 100.

Specifically, referring to FIG. 2, forming the first stress layer 121 and the second stress layer 122 may include thrilling a first opening 121p in the substrate 100 in the first region 100a and a second opening 122p in the substrate 100 in the second region 100b. The first opening 121p and the second opening 122p may be configured to form the first stress layer 121 and the second stress layer 122.

In one embodiment, the substrate may be configured to form a PMOS device. In other words, the current in the channel region of the MOS transistor in the semiconductor structure can be realized by holes. Therefore, compressive stress may need to be introduced into the channel region of the formed MOS transistor. A Sigma ("Σ") shaped stress layer may be needed to introduce larger compressive stress. Therefore, forming the first opening 121p and the second opening 122p may include forming the Sigma "Σ"shaped first opening 121p and second opening 122p.

Forming the first opening 121p and the second opening 122p may include: forming a second patterned layer on the substrate 100, where the second patterned layer may be, configured to define the dimensions and positions of the first opening 121p and the second opening 122p; and using the second patterned layer as a mask to etch the substrate 100 to form the first opening 121p and the second opening 122p in the substrate 100. The second patterned layer may be a patterned photoresist layer, or a mask layer formed by a multiple patterned mask process.

Referring to FIG. 3, after forming the first opening 121p and the second opening 122p, forming the first stress layer 121 and the second stress layer 122 may also include filling the first opening and the second opening 122) with a corresponding stress material to form the first stress layer 121 and the second stress layer 122, respectively.

In one embodiment, a chemical vapor deposition process may be performed to fill the first opening 121p and the second opening 122p with the corresponding stress material. In certain embodiments, a reactive plasma chemical vapor deposition process may be performed to fill the first opening 121p and the second opening 122p with the corresponding stress material.

Because the substrate 100 may be configured to form a PMOS device, compressive stress may need to be introduced into the channel region. Therefore, the stress material may be, for example, a germanium silicon material. In other words, the first stress layer 121 and the second stress layer 122 may be the germanium-silicon stress layer.

For example, when performing the reactive plasma Chemical vapor deposition process to fill the first stress layer 121 and the second stress layer 122 with the germanium-silicon material, the process temperature may be in a range of approximately 550° C.-750° C., and the pressure of the process gas may be in a range of approximately 0 Torr-50 Torr. The process gas may include monosilane disilane, and dichlorosilane configured as silicon source and germane configured as germanium source.

In addition, the substrate 100 may be configured to form a PMOS device. When forming the first stress layer 121 and the second stress layer 122, P-type doped stress layers ma be formed by in-situ doping P-type ions into the stress layer. In other words, the first stress layer 121 and the second stress layer 122 may be the P-type doped stress, layers. In one embodiment, the P-type ions may be boron ions. Therefore, when performing the reactive plasma chemical vapor deposition process to fill the first opening 121p and the second opening 122p with the germanium-silicon material, the process gas may also include diborane used as boron source.

In one embodiment, the first stress layer 121 and the, second stress layer 122 may be the "Σ" shaped stress layers to increase the compressive stress in the channel region. The "Σ" shaped stress layer may have a protruding tip pointing towards the channel region. The germanium-silicon material at the protruding tip may be closer to the channel region and can introduce larger compressive stress in the channel region.

The first stress layer 121 and the second stress layer 122 may be formed at both sides of the isolation structure 110. The top surface of the isolation structure 110 may be level with the surface of the substrate 100. Therefore., both the top surfaces of the first stress layer 121 and the second stress layer 122 may be above the top surface of the isolation structure 110.

The first opening 121p (shown in FIG. 2) and. the second opening 122p (shown in FIG. 2) may be overfilled, therefore, both the top surfaces of the first stress layer 121 and the second stress layer 122 may be above the top surface of the isolation structure 110. Therefore, spacing between the adjacent side surfaces of the first stress layer 121 and the second stress layer 122 and above the isolation structure 110 becomes smaller.

Figure 4:
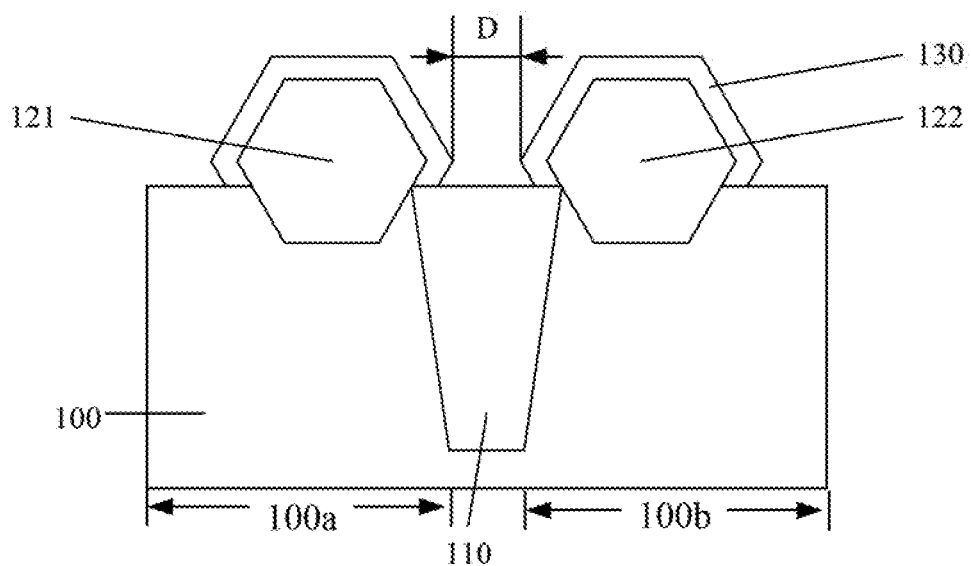

Returning to FIG. 8, after forming the substrate, a cover layer may be formed at the first stress layer and the second stress layer (S102). FIG. 4 illustrates a corresponding semiconductor structure.

As shown in FIG. 4, a cover layer 130 may be formed on the first stress layer 121 and the second stress layer 122. For example, the cover layer 130 may be configured to form the self-aligned silicide. Therefore, the cover layer 130 may be a silicon layer.

Because the first stress layer 121 and the second stress layer 122 may be made of germanium-silicon, crystal planes of the top surfaces and sidewalls of the first stress layer 121 and the second stress layer 122 may be different. If the process temperature of forming the cover layer is too low, the selectivity of atoms to the crystal plane may be strong during forming the cover layer 130. In one embodiment, the formed cover layer 130 may be difficult to cover the sidewalls of the first stress layer 121 and the second stress layer 122, thus impacting the formation of the self-aligned silicide. Therefore, in one embodiment, the process temperature of forming the cover layer 130 may be in a range of approximately 600° C.-800° C., and the process gas may include monosilane, and disilane.

Forming the cover layer 130 may further reduce the distance 'D' between the adjacent side surfaces of the first stress layer 121 and the second stress layer 122. If the distance 'D' between the adjacent side surfaces of the first stress layer 121 and the second stress layer 122 is too small, the silicide subsequently formed on the surfaces of the first stress layer 121 and the second stress layer 122 through the cover layer 130 may be connected, thus resulting in a short-circuit issue between devices in different active areas on both sides of the isolation structure 110.

Figure 5:
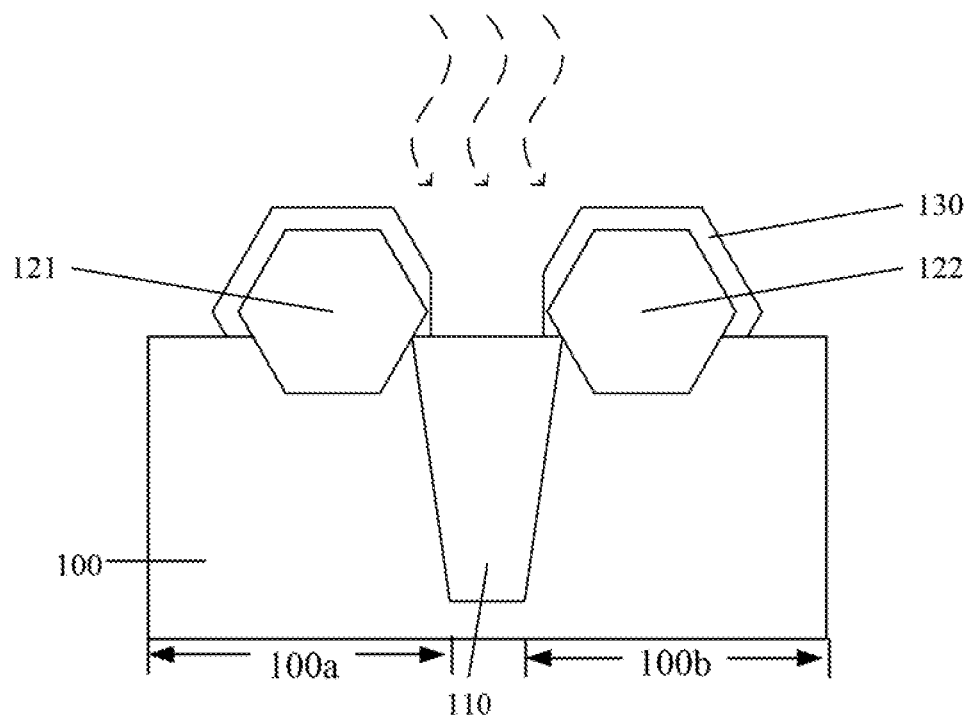

Returning to FIG. 8, after forming the cover layer, portions of the cover layer formed on the adjacent side surfaces of the first stress layer and the second stress layer may be removed (S103). FIG. 5 illustrates a corresponding semiconductor structure.

As shown in FIG. 5, after forming the cover layer 130, portions of the cover layer 130 formed on the adjacent side surfaces of the first stress layer 121 and the second stress layer 122 may be removed. In one embodiment, the etching gas may be used U. etch the cover layer 130 formed on the adjacent side surfaces of the first stress layer 121 and the second stress layer 122, and to remove portions of the cover layer 130 formed on the adjacent side surfaces of the first stress layer 121 and the second stress layer 122.

The etching process may be used to remove portions of the cover layer 130 formed on the adjacent side surfaces of the first stress layer 121 and the second stress layer 122. The distance between cover layers 130 formed on the adjacent side surfaces of the first stress layer 121 and the second stress layer 122 may be increased. The probability of connecting the cover layers 130 formed on the adjacent side surfaces of the first stress layer 121 and the second stress layer 122 and the probability of connecting the subsequently formed silicide through the cover layer 130 may be reduced. The short-circuit issue of the device may be improved.

During the etching process, the etching gas used in the etching process may include gas capable of achieving silicon city etching, such as one or inure of hydrogen chloride gas, sulfur hexafluoride gas, hydrogen bromide gas, and chlorine gas, etc. In one embodiment the etching gas may include hydrogen chloride gas.

In addition, when forming the cover layer 130, amorphous materials may be easily formed on the surfaces, and connection corners of the first stress layer 121, the second stress layer 122, and the isolation structure 110. In other words, amorphous silicon may be easily stacked on the surfaces and connection corners of the first stress layer 121, the second stress layer 122, and the isolation structure 110. The etching process may also remove the stacked amorphous silicon.

Figure 6:
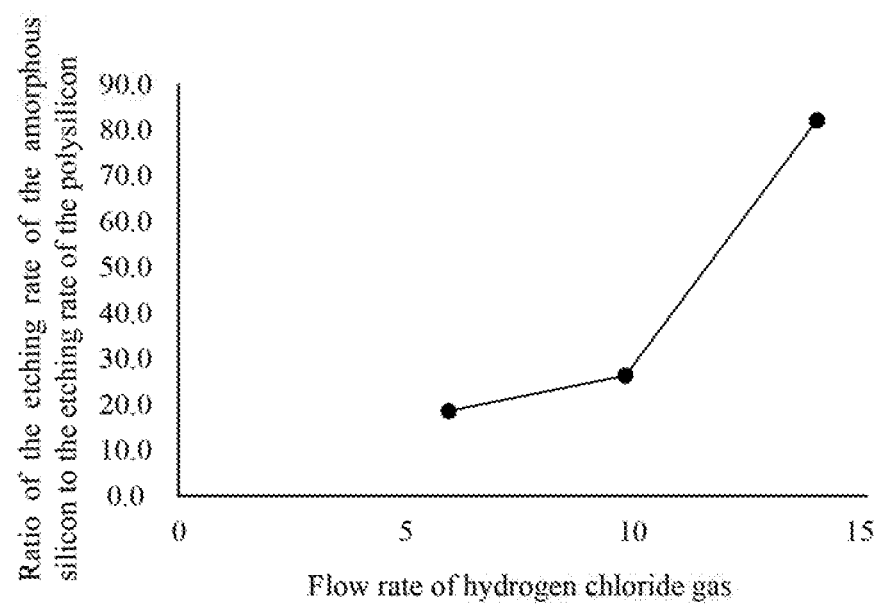

For example, FIG. 6 illustrates a ratio of an etching rate of the amorphous silicon to an etching rate of the polysilicon as a function of flow rate of the hydrogen chloride gas. The horizontal axis represents the flow rate of the hydrogen chloride gas, and the vertical axis represents the ratio of the etching rate of the amorphous silicon to the etching rate of the polysilicon. As shown in FIG. 6, as the flow rate of the hydrogen chloride gas increases, the ratio of the etching rate of the amorphous silicon to the etching rate of the polysilicon may become larger. In other words, as the flow rate of the hydrogen chloride gas increases, the etching rate of the amorphous silicon may become larger than the etching rate of the polysilicon. Therefore, the etching process performed by the hydrogen chloride gas may remove the amorphous silicon defects stacked on the surfaces and/or corners.

If the flow rate of the hydrogen chloride gas is too large, it may cause too large removed thickness of the cover layer 130, easily impact the thickness of subsequently formed silicide through the cover layer 130, and impact the amplitude of the contact resistance between the metal plug and the first stress layer 121 and the second stress layer 122. If the flow rate of the hydrogen chloride gas is too small, the amorphous silicon defects stacked on the surfaces and/or corners may be difficult to remove.

In addition, if the pressure of the etching gas is too small, the cover layer 130 formed on the adjacent side surfaces of the first stress layer 121 and the second stress layer 122 may be difficult to shock, and portions of the cover layer 130 cannot be effectively removed. If the pressure of the etching gas is too large, it may cause damages to the cover layer 130, and even cause damages to the first stress layer 121 and the second stress layer 122.

In one embodiment, when performing the etching process, the flow rate of the etching gas may be in a range of approximately 0 sccm-50 sccm, the pressure of the etching gas may be in a range of approximately 0 Torr-50 Torr, and the etching temperature may be in a range of approximately 550° C.-750° C. Other parameters may also be used according to the specific design and requirements of the semiconductor structure according to various embodiments of the present disclosure.

The thickness of the cover layer removed by the etching process may be determined according to the distance between the active areas in the semiconductor structure. When the design requires a large distance between the active areas, the thickness of the removed cover layer may be large. When the design requires a small distance between the active areas, the thickness of the removed cover layer may be small.

When performing the etching process, the etching process may be an in-situ etching process. In other words, after completing the final film deposition, the in-situ etching process may be performed in the same process chamber. The advantage of this method includes that the machine or the chamber may not need to be replaced, reducing the process steps and process difficulty, and improving the process efficiency.

Returning to FIG. 8, after removing portions of the cover layer formed on the adjacent side surfaces of the first stress layer and the second stress layer, a metal layer may be formed (S104). FIG. 7 illustrates, a corresponding semiconductor structure.

Referring to FIG. 7, a metal layer 140 may be formed on the cover layer 130. The metal layer 140 may cover the surface of the cover layer. The metal layer 140 may react with the cover layer 130 to form silicide by a subsequent annealing process, to reduce the contact resistance between the metal plug and the first stress layer 121 and the second stress layer 122. In one embodiment, the metal layer 140 may be made of nickel. The metal layer 140 may be formed on the cover layer by a chemical vapor deposition process, a physical vapor deposition process, or a atomic layer deposition process, etc.

The metal layer 140 may also cover the surface of the isolation structure 110 (not labeled). Because the isolation structure 110 may be made of an oxide material, the metal layer 140 may not react with the isolation structure 110 by controlling the annealing process. Therefore, the formation of the silicide is a self-aligned process. After performing the annealing process, the unnecessary metal layer may be removed by an etching process, and the formed silicide may only cover the first stress layer 121 and the second stress layer 122.

Accordingly, in the disclosed embodiments, after forming the cover layer, portions of the cover layer formed on the adjacent side surfaces of the first stress layer and the second stress layer may be removed. Therefore, the distance between the first stress layer and the second stress layer formed on both sides of the isolation structure may be enlarged, and the device performance issue caused by the too small distance between the adjacent stress layers may be effectively improved. In addition, removing portions of the cover layer may also remove the stacked defects formed on the cover layer formed on the adjacent side surfaces of the first stress layer and the second stress layer, thus improving the performance of the formed semiconductor device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a substrate including a first region for forming a first transistor and a second region for forming a second transistor;
   forming a first stress layer in the substrate in the first region and a second stress layer in the substrate in the second region, wherein top surfaces of the first stress layer and the second stress layer are above a surface of the substrate;
   forming a cover layer on each of the first stress layer and the second stress layer; and
   removing portions of the cover layer formed on adjacent side surfaces of the first stress layer and the second stress layer.

2. The method according to claim 1, wherein removing portions of the cover layer formed on the adjacent side surfaces of the first stress layer and the second stress layer includes:
   using an etching gas to etch and remove the cover layer formed on the adjacent side surfaces of the first stress layer and the second stress layer.

3. The method according to claim 2, wherein:
   the etching gas includes one or more of hydrogen chloride gas, sulfur hexafluoride gas, hydrogen bromide gas and chlorine gas.

4. The method according to claim 2, wherein:
   a flow rate of the etching gas is in a range of approximately 0 sccm-50 sccm.

5. The method according to claim 2, wherein:
   a pressure of the etching gas is in a range of approximately 0 Torr-50 Torr; and
   an etching temperature is in a range of approximately 550° C.-750° C.

6. The method according to claim 2, further including:
   using the etching gas in an in-situ etching process.

7. The method according to claim 1, wherein:
   the cover layer is a silicon layer.

8. The method according to claim 1, wherein, when forming the cover layer:
   a process temperature is in a range of approximately 600° C.-800° C.

9. The method according to claim 1, wherein, when forming the cover layer:
   a process gas includes monosilane and disilane.

10. The method according to claim 1, wherein the substrate further includes:
    an isolation structure in the substrate between the first region and the second region.

11. The method according to claim 1, wherein forming the first stress layer in the substrate in the first region and the second stress layer in the substrate in the second region includes:
    forming a first opening in the substrate in the first region and a second opening in the substrate in the second region; and
    filling the first opening and the second opening with a stress material to form the first stress layer and the second stress layer, respectively.

12. The method according to claim 11, wherein filling the first opening and the second opening with the stress material includes:
  performing a chemical vapor deposition process to fill the first opening and the second opening with the stress material to form the first stress layer and the second stress layer.

13. The method according to claim 12, wherein filling the first opening and the second opening with the stress material by the chemical vapor deposition process includes:
  performing a reactive plasma chemical vapor deposition process to fill the first opening and the second opening with the stress material to form the first stress layer and the second, stress layer.

14. The method according to claim 13, wherein;
  the first stress layer and the second stress layer are made of a germanium-silicon material.

15. The method according to claim 14, wherein the chemical vapor deposition process of filling the first opening and the second opening with the stress material includes:
  a process temperature in a range of approximately 550° C.-750° C.;
  a process gas including monosilane, disilane, dichlorosilane, and germane; and
  a pressure of the process gas in a range of approximately 0 Torr-50 Torr.

16. The method according to claim 15, wherein:
  when the first stress layer and the second stress layer are P-type doped stress layers, the process gas also includes diborane.

17. The method according to claim 11, wherein forming the first opening and the second opening includes:
  forming the Sigma ("Σ") shaped first opening and second opening for forming a P-type transistor.

18. The method according to claim 1, after removing portions of the cover layer formed on the adjacent side surfaces of the first stress layer and the second stress layer, further including:
  forming a metal layer on the cover layer by one of a chemical vapor deposition process, a physical vapor deposition process, and an atomic layer deposition process.

19. The method according to claim 18, wherein:
  the metal layer is made of nickel.

20. The method according to claim 18, further including:
  annealing the metal layer and the cover layer to form a silicide layer.

* * * * *